United States Patent [19]
Lattimore et al.

[11] Patent Number: 5,877,976
[45] Date of Patent: Mar. 2, 1999

[54] MEMORY SYSTEM HAVING A VERTICAL BITLINE TOPOLOGY AND METHOD THEREFOR

[75] Inventors: George McNeil Lattimore, Austin; Robert Anthony Ross, Jr., Cedar Park, both of Tex.

[73] Assignee: International Business Machines Corporation, Armonk, N.Y.

[21] Appl. No.: 959,478

[22] Filed: Oct. 28, 1997

[51] Int. Cl.[6] ........................................... G11C 5/06
[52] U.S. Cl. ................ 365/63; 365/230.05; 365/189.04; 365/156; 365/190
[58] Field of Search ................ 365/63, 230.05, 365/189.04, 154, 156, 190

[56] References Cited

U.S. PATENT DOCUMENTS

| | | | |
|---|---|---|---|
| 4,366,558 | 12/1982 | Homma et al. | 365/204 |
| 4,608,669 | 8/1986 | Klara et al. | 365/201 |
| 4,803,663 | 2/1989 | Miyamoto et al. | 365/189.11 |
| 4,807,017 | 2/1989 | Ema et al. | 257/776 |
| 4,980,860 | 12/1990 | Houston et al. | 365/189.11 |
| 5,107,459 | 4/1992 | Chu et al. | 365/63 |
| 5,144,583 | 9/1992 | Oowaki et al. | 365/206 |
| 5,214,601 | 5/1993 | Hidaka et al. | 365/63 |
| 5,292,678 | 3/1994 | Dhong et al. | 437/50 |
| 5,459,851 | 10/1995 | Nakajima et al. | 395/476 |
| 5,468,985 | 11/1995 | Harima | 257/385 |
| 5,563,820 | 10/1996 | Wada et al. | 365/63 |
| 5,567,963 | 10/1996 | Rao | 257/296 |
| 5,581,126 | 12/1996 | Moench | 257/776 |
| 5,586,072 | 12/1996 | Longway et al. | 365/63 |

*Primary Examiner*—David Nelms
*Assistant Examiner*—Andrew Q. Tran
*Attorney, Agent, or Firm*—Elizabeth A. Apperley; Winstead Sechrest & Minick P.C.; Anthony V. S. England

[57] ABSTRACT

An improved topology for multi-port memory cell layouts in which two or more bitline pairs are required for data transfers is provided. Bitlines are displaced vertically, rather than horizontally. Such vertical spacing provides improved silicon density while reducing bitline capacitance of a memory cell. Additionally, the use of vertically separated bitline pairs allows traditional transitional phase relationships between multi-port operations in multi-port memory implementations. To nullify any sensitivity to an overlapping restore operation, this improved topology includes cross-coupled ports.

20 Claims, 7 Drawing Sheets

FIG. 10A
PORT_1 BITLINES
ON METAL 2

FIG. 10B
PORT_2 BITLINES
ON METAL 3

FIG. 10C
PORT_1 BITLINES
OVERLAY

| | | |
|---|---|---|
|  METAL 3 |  METAL 3 |  RX |
|  METAL 2 |  POLY |  CELL BORDER |

MEMORY SYSTEM HAVING A VERTICAL BITLINE TOPOLOGY AND METHOD THEREFOR

CROSS-REFERENCE TO RELATED APPLICATIONS

This Application is related to the commonly assigned, co-pending patent applications filed simultaneously herewith and entitled:

"A Data Processing System and Method for Implementing a Multi-Port Memory Cell," by George M. Lattimore, et al., U.S. application Ser. No. 08/958,599, filed Oct. 28, 1997, pending "A Data Processing System and Method for Generating Memory Control Signals with Clock Skew Tolerance," by George M. Lattimore, et al., U.S. application Ser. No. 08/959,653, filed Oct. 28, 1997, pending and "Method and Apparatus for Single Clocked, Non-Overlapping Access in a Multi-Port Memory Cell," by George M. Lattimore, et al., U.S. application Ser. No. 08/959,652, filed Oct. 28, 1997, pending, which are hereby incorporated by reference herein.

TECHNICAL FIELD

The present invention relates in general to memory circuits, and in particular, to a topology of a plurality of bitlines of a memory circuit.

BACKGROUND INFORMATION

As the semiconductor industry has developed data processing systems which provide increased functionality at faster speeds, a key component for implementing these systems has been a memory for storing programs and applications needed by the system. With increased demands for faster data processing systems, comes increasing demands for larger and faster memories which store more applications and deliver that program information more quickly. In turn, with increasing demands for larger and faster memories, a die size and the manufacturing costs associated with developing the memory must be maintained. These constraints have driven designers of memories to push the technological limits of feature size reductions with any conceivable process enhancement. However, as feature sizes continue to decrease within the two-dimensional planar surface of a silicon substrate, electrical effects such as line-to-line capacitive coupling become more dominant and, eventually consume much of the performance enhancements sought by the reduced feature sizes. Therefore, a challenge in current memory development is to improve the relationships between design parameters and process results to better utilize the limited resources of a silicon substrate for transistor structures and to exploit the vertical topology for all other non-device structures.

Figure 1:
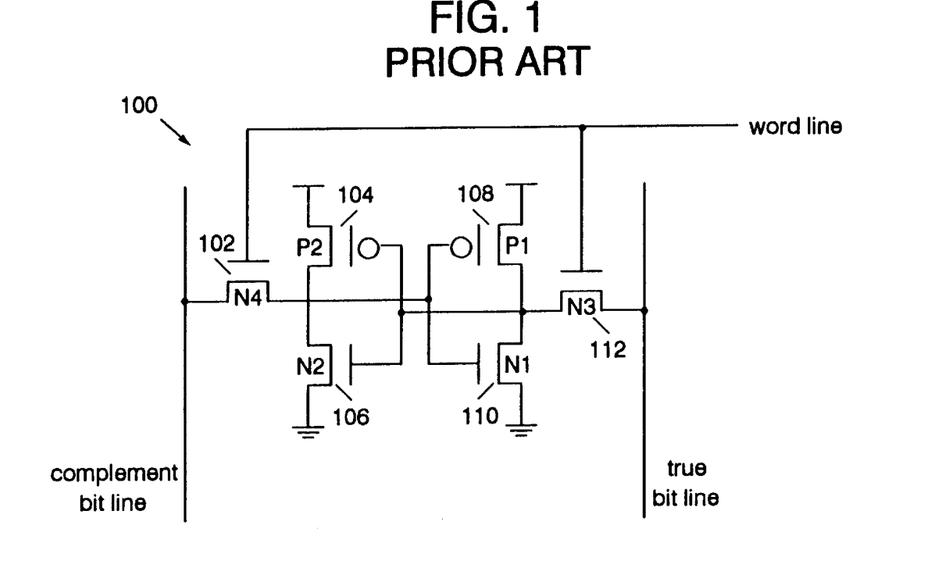
FIG. 1 illustrates a prior art implementation of a single port static memory cell.

In implementing a memory in past data processing systems, a memory cell such as that illustrated in FIG. 1 was typically utilized. In memory cell 100 of FIG. 1, six transistors perform the functions of a single port SRAM cell. Memory cell 100 comprises four n-type transistors 102, 106, 110, and 112, and two p-channel devices 104 and 108. Transistors 104–110 create a cross-coupled memory latch which is used to store data. Transistors 102 and 112 are transfer devices which provide access into and out of the latch under control of a word line signal. In a memory configuration, many memory cells are common to each bitline pair, complement bitline and true bitline. Furthermore, it is the function of transfer devices 102 and 112 to provide an open pathway between the cross-coupled memory latch and the external environment for the performance of "read" operations and "write" operations.

Figure 2:
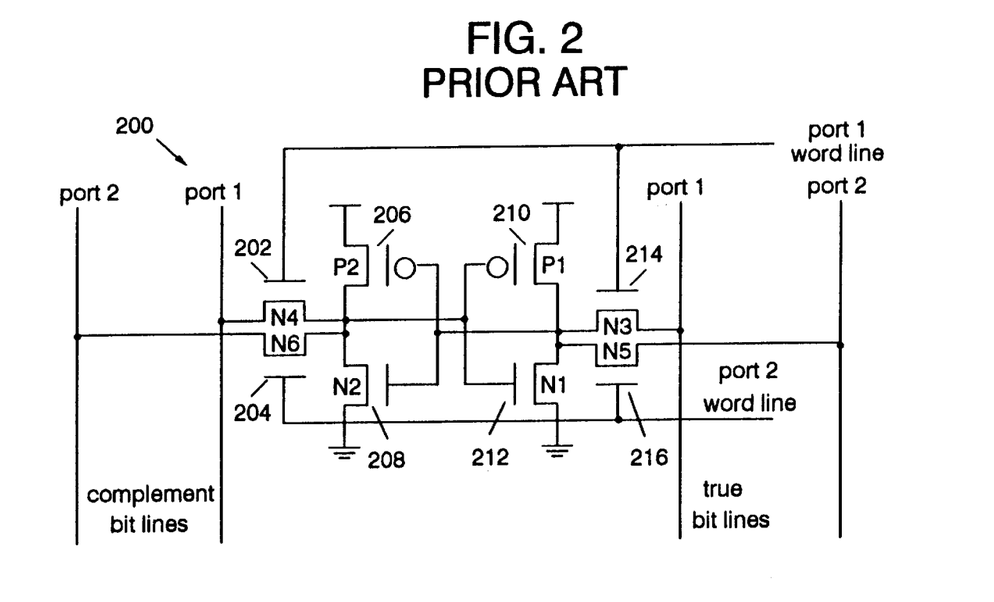
FIG. 2 illustrates, in logic diagram form, a two port static memory cell in accordance with prior art implementations.

While FIG. 1 illustrates a typical implementation of a single port static memory cell, FIG. 2 illustrates a two-port static memory cell 200. In a dual port memory cell, such as memory cell 200, two separate paths are provided to read and write the same four device cross-coupled memory latch described in single port SRAM cell 100 in FIG. 1. A first transfer path is defined by transistors 202 and 214 which are coupled to bitlines in a wordline corresponding to port 1. Similarly, transistors 204 and 216 provide a second transfer path corresponding to a second port of the dual port memory cell 200. The additional transfer devices are implemented to execute a second and separate read and write to memory cell 200. Furthermore, in order to maintain each port's unique identity, an additional pair of bitlines is also required. In the more traditional two-port memory cell layouts, such as that illustrated in FIG. 2, the second pair of bitlines are placed adjacent to and in the same wiring plane as the first pair of bitlines. This placement requires more surface area to implement and, therefore, increases the overhead associated with implementing such dual-port memory cells. To minimize silicon surface area, these bitlines are often placed as close together as the manufacturing process will allow. These parallel bitlines typically have lengths ranging from 64 to 512 cells in height. Additionally, these parallel bitlines become very sensitive to transitions on neighboring bitlines.

The sensitivity is a result of increased bitline-to-bitline capacitance. Increased bitline-to-bitline capacitance from traditional layouts and implementations of dual-port memories reduces the effectiveness of differential bitline sensing, a technique which is common place in memory designs. In such differential bitline sensing, a small amount of differential offset developed between bitline pairs during a read operation is detected. For example, when a transfer device, such as transistors 202, 204, 214, and 216 is enabled, a portion of the memory cell begins to discharge one of the two precharged differential bitline pairs, wherein the differential bitline pairs are precharged to a first reference voltage Vdd. An offset between true and complement bitlines continues to increase, until the differential between the bitline pairs is sufficient to be detected reliability by a differential amplifier, commonly referred to as a sense amplifier in the data processing area. During this discharge and sensing step, line-to-line coupling detracts from the differential offset development by transferring charge from one bitline to another. As a result, discharge of the differential bitlines must continue to consume more cycle time to compensate for the charge transfer or loss between the reference bitline and an active (pulldown) bitline.

Several techniques have been implemented to manufacture dual-port memory cells with higher density. One such implementation is disclosed in U.S. Pat. No. 5,292,678 by Dhong, et al., and assigned to International Business Machines Corporation. In U.S. Pat. No. 5,292,678, a folded bitline architecture is used to implement a high density memory layout, including DRAMs. In this type of folded bitline architecture, bit pairs are manufactured to be vertically aligned with one another, and are typically separated by a passivation or other resistive layer during a processing step. The folded bitline approach attempts to use two metal layers for manufacturing purposes within one horizontal wiring plane by using some special processing steps. These special processing steps are often expensive and are difficult to manufacture.

Therefore, a need exists for a dual-port memory cell having configuration and layout which provides for greater density and reduces an amount of cross-coupling among elements of the memory cell while using standard manufacturing processes.

SUMMARY OF THE INVENTION

The previously mentioned needs are fulfilled with the present invention. Accordingly, there is provided, in a first form, a memory cell in a data processing system. The memory cell includes a first latch for storing a first data value. The first latch includes a first true bitline and a first complement bitline. The memory cell also includes a second latch for storing a second data value. The second latch includes a second true bitline and a second complement bitline. The first true bitline and the second complement bitline are vertically aligned. The first complement bitline and the second true bitline are vertically aligned.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the companying drawings, in which.

DETAILED DESCRIPTION

The present invention discloses an improved topology for multi-port memory cell layouts in which two or more bitline pairs are required for data transfers. In the present invention, bitlines are displaced vertically, rather than horizontally, as was done with prior art implementations. A more detailed description of the present invention and operation thereof will subsequently be provided below.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Furthermore, it should be understood that the data presented herein discussed a dual-port memory cell, but may easily be extended to any combination of ports to which the topology of the present invention may be applied.

Refer now to the drawings wherein depicted elements are not necessarily shown to scale and wherein like or similar elements are designated by the same reference numeral through the several views.

Figure 3:
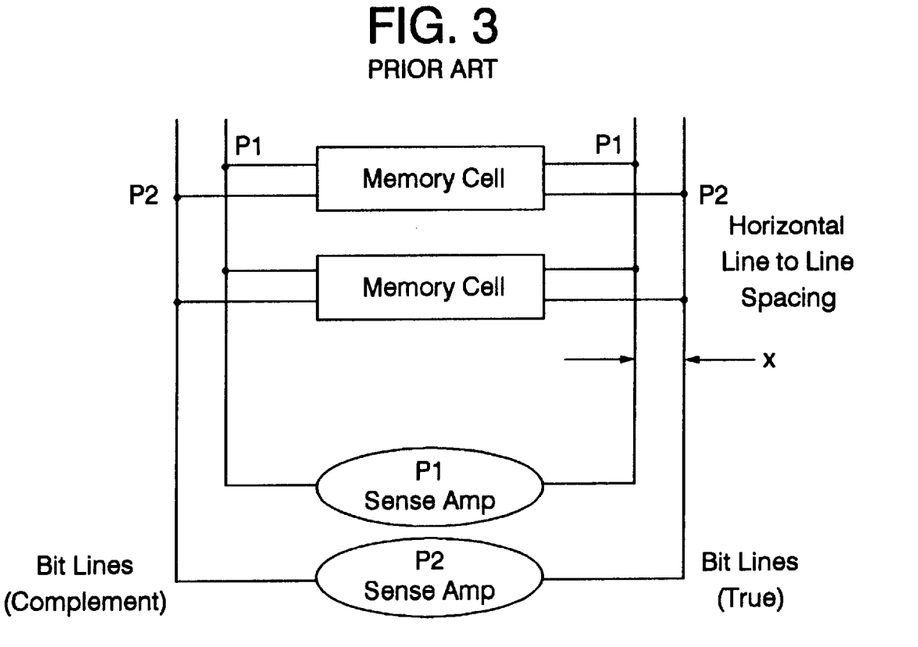
FIG. 3 illustrates, in block diagram form, a planar bitline topology in accordance with a prior art implementation.
Figure 4:
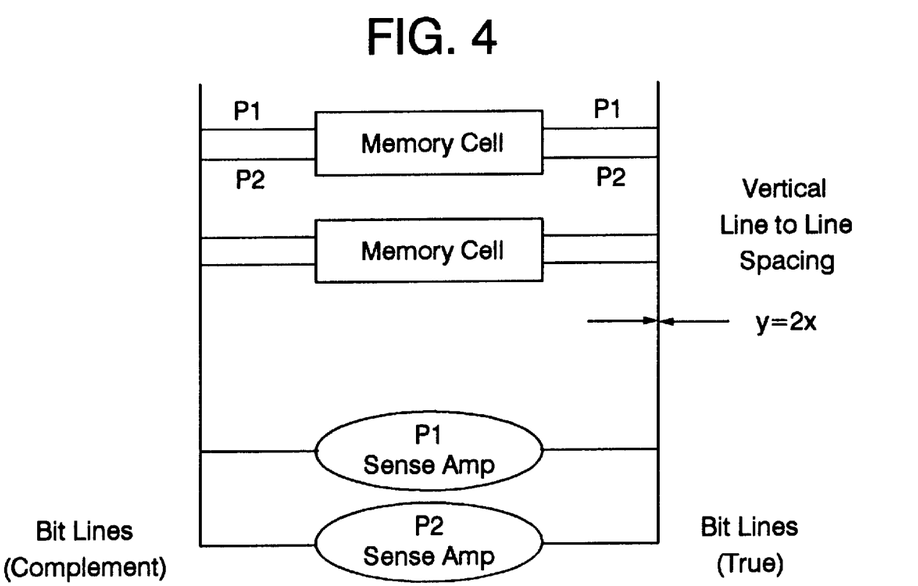
FIG. 4 illustrates, in block diagram form, a vertical bitline topology in accordance with one embodiment of the present invention.

To provide a general overview of the differences between prior art implementations of dual-port memory cells and the present invention, refer now to FIGS. 3 and 4. FIG. 3 provides a block diagram for the dual port memory cell of FIG. 2. In FIG. 3, the bitlines to each of the memory cells are displaced horizontally with distance "x" between the bitline pairs. As previously mentioned, it should be noted that "x" is typically a minimum line-to-line spacing defined by process parameters of a fabrication facility in which the device is manufactured. In contrast to the typical implementation illustrated in FIG. 3, bitlines in the dual-port memory cell of the present invention are vertically stacked upon one another during the manufacturing process, as illustrated in FIG. 4. The two bitlines are separated by a passivation layer which typically have a thickness of "2x." The thickness "2x" indicates a minimum passivation thickness between wiring levels defined by process parameters of a fabrication facility in which the device is being manufactured. By vertically separating bitlines in this manner, there is, in effect, a substantial increase in bitline-to-bitline spacing between ports of a memory cell. Vertically separated bitlines of a first port and a second port reduces coupling two times over that experienced by prior art configurations. This is fundamentally due to the vertical spacing between layers of a device in current technologies is greater than the horizontal spacing within a layer.

Also in contrast to the implementation illustrated in FIG. 3, the dual port memory cell of the present invention illustrated in FIG. 4, consumes less silicon area. The area requirement to fabricate the second pair of bitlines is consumed in the vertical wiring topology above the first pair of bitlines; not in the same wiring plane that defines the first bitline pair. No additional silicon surface area is required for the second bitline pair implemented as is a common practice in prior art techniques. This reduction in cell area due to vertically stacked bitlines generates increased silicon density which provides for smaller more compact memory array designs and lower manufacturing costs as a result of decreases in silicon usage.

Figure 5:
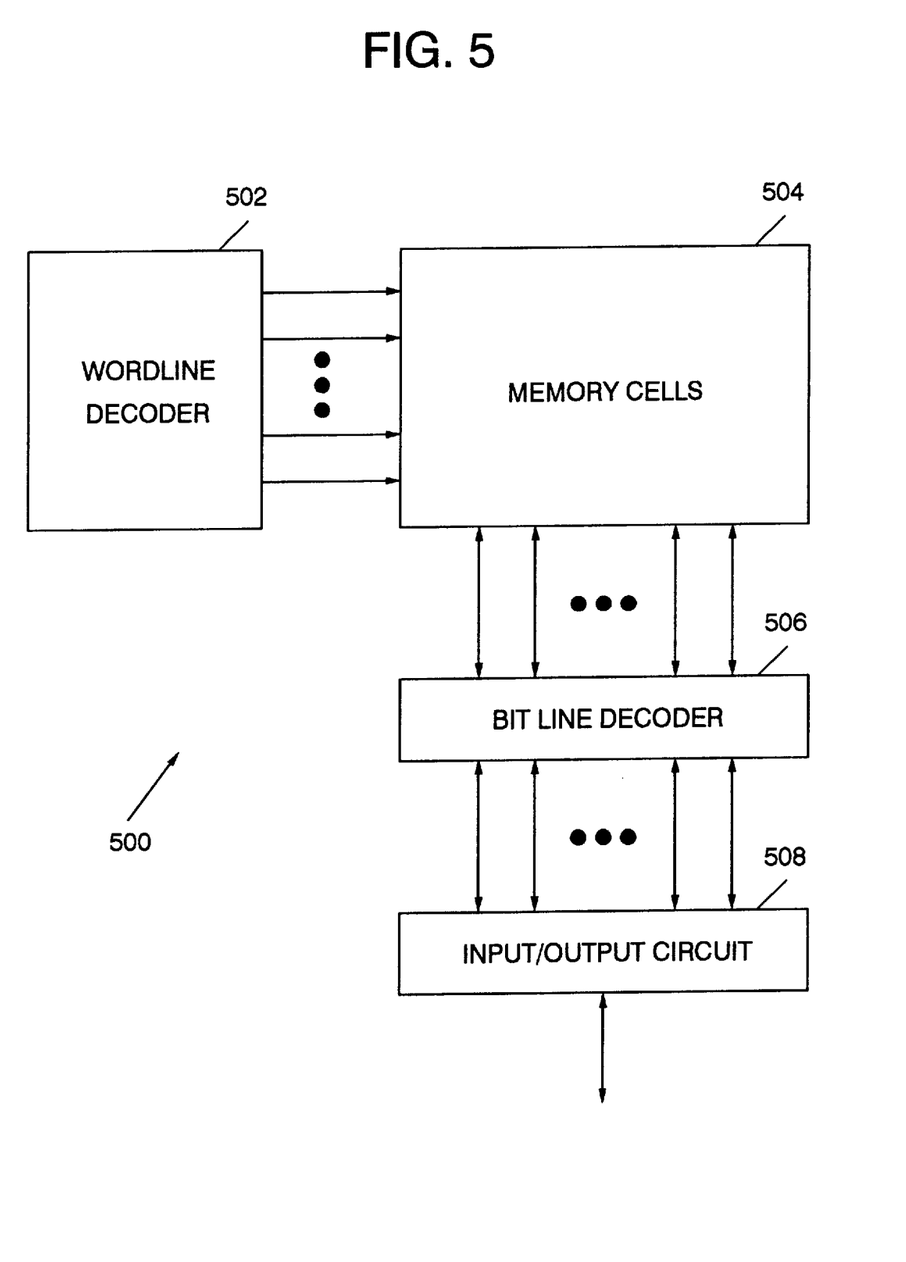
FIG. 5 illustrates, in block diagram form, a memory array in accordance with ones embodiment of the present invention.

However, to fully understand the benefits of the present invention, the functional application and environment in which the cell operations will be provided below. FIG. 5 illustrates a typical memory system 500. In memory system 500, data is provided to a wordline decoder 502, which decodes the data and drives a decoded data value to a plurality of memory cells 504. Concurrently, input/output circuit 508 provides data to bitline decoder 506. Bitline decoder 506 decodes that information and accesses a selected memory cell by asserting a pair of bitlines. As previously mentioned, in one embodiment of the present invention, each of the plurality of memory cells 504 is implemented as a multi-ported memory, such as a dual-port memory.

Figure 6:
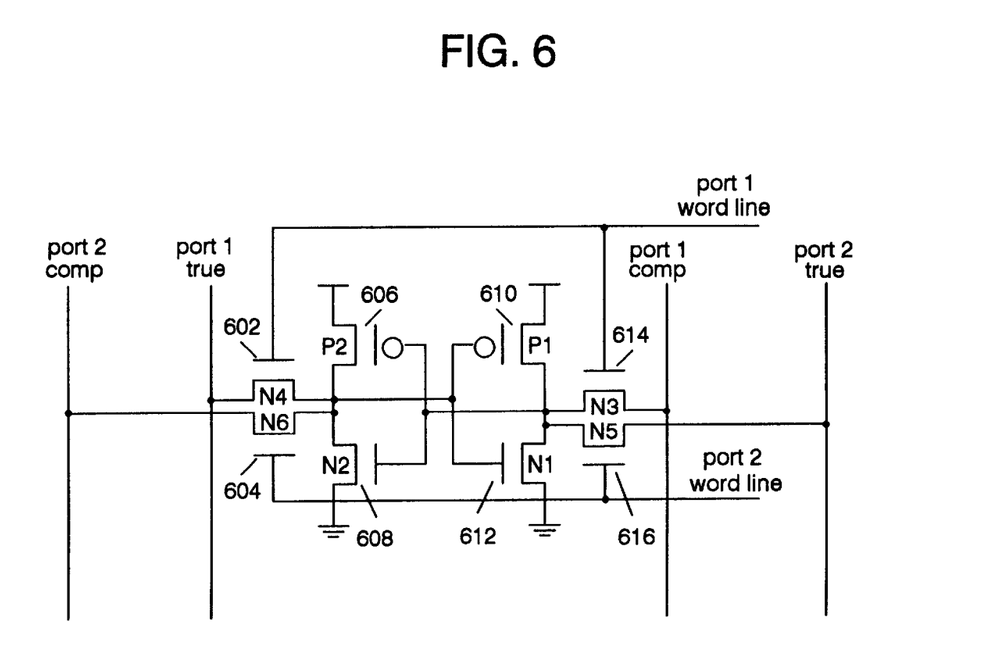
FIG. 6 illustrates, in circuit diagram form, a dual-port static memory cell in accordance with one embodiment of the present invention.

Furthermore, in one embodiment of the present invention, a less traditional dual-port memory cell may be implemented. The less traditional dual-port memory cell is illustrated in FIG. 6. In the dual-port memory cell of FIG. 6, pull-down devices, transistor 612 and transistor 608, are smaller than corresponding transistors 208 and 212 in FIG. 2. The larger devices in the traditional dual-port memory of FIG. 2 are required to maintain a read stable beta ratio between the transfer devices and the pull-down devices, when both transfer devices are simultaneously active. In the memory cell of FIG. 6, the size of the pull-down devices has been reduced by prohibiting the concurrent activation of the port 1 and port 2 transfer devices (transistor 602 and 612 and transistor 604 and 616) through the use of non-overlapping wordlines. By prohibiting such concurrent activation of transfer devices corresponding to port 1 and port 2, the pull-down devices may be manufactured as a smaller size and, therefore, less silicon area is consumed to construct an entire memory cell array.

By separating port 1 and port 2 read and write operations into non-overlapping time domains in one embodiment of the present invention, an opportunity is provided for using the vertically aligned bitline topology of the present invention. During a read or write operation to any one of the two available ports within the memory cell of FIG. 6, the bitlines attached to an inactive port are actively held to a reference voltage value. This step of actively holding the bitline to the reference voltage value is referred to as a step of "restoring." By implementing the restoring step, there can be no degradation in bitline signal development on one port due to simultaneous switching on another.

In addition to providing improved silicon density without adding capacitance to a memory cell, the use of vertically separated bitline pairs in accordance with the present invention allows traditional transitional phase relationships between port 1 and port 2 operations in dual-port memory implementations such as that illustrated in FIG. 6. For example, assume that a read or write operation has just been performed on the dual-port static memory cell of FIG. 6. Furthermore, assume that this read or write operation has been performed using well-known techniques whereby an appropriate one of the Port 1 or Port 2 wordlines is asserted, together with an appropriate one of the Port 1 or Port 2 true and complement bitlines. If a read operation was performed using port 2 of the memory cell, the Port 2 true bitline will remain discharged at or near a reference ground voltage. This Port 2 true bitline must then be restored to a reference voltage (Vdd) prior to performance of another read operation. In the event that a restore operation does not occur, incorrect data may be interpreted from data still present on the Port 2 true bitline, rather than from the newly requested memory cells enabled to provide data onto the bitlines. Furthermore, the newly requested cell may also rewrite itself with bad or stagnate data still present on the bitlines from a previous read or write operation.

These issues are compounded by the fact that tightly controlled memory designs rarely allow sufficient time to complete a restore operation before a next memory request is made. In an attempt to gain additional restore time, a common design practice essentially "steals" the time required to complete the restore from a front end portion of a next timing cycle corresponding to the memory operation. However, for multi-port memory cells, restoring one port while developing "offset" on another port during a read operation may significantly limit performance of the memory cell. For example, a bitline pulled low during a previous write operation would experience a full rail-to-rail voltage swing during the restore operation, as is well-known to those with skill in the data processing art. If the first port is being restored and the second port is enabled for reading (i.e., a snoop operation following a write operation), a bitline being discharged during the read operation would be coupled to a high logic level by a bitline restore transition on the first port. This coupling results in a loss of differential offset on the second port being read. This loss of differential offset will require additional time to generate sufficient offsets to reliably sense the state of the memory latch and, therefore, to correctly read the data value stored therein.

Figure 7:
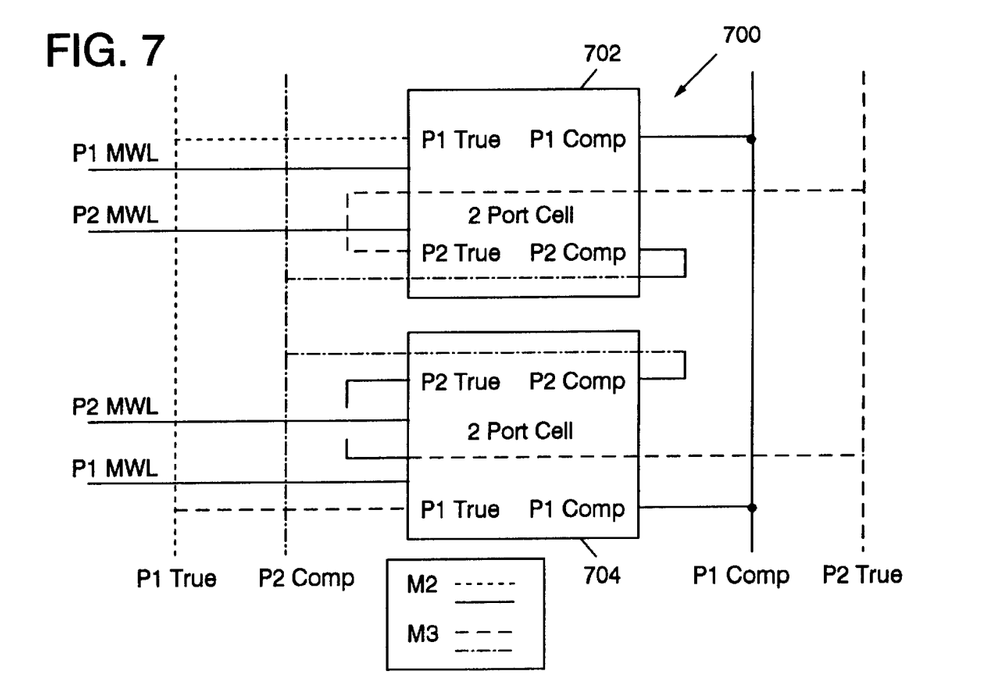
FIG. 7 illustrates, in block diagram form, a cross-connected dual-port memory cell in accordance with one embodiment of the present invention.

In an attempt to nullify any snoop to an overlapping restore operation, the present invention comprises cross-connected ports with a vertical topology design. Furthermore, in the design methodology of the present invention, bitline coupling is minimized by changing an order of the true and complement bitlines between vertical wiring levels. FIG. 7 illustrates a configuration in which bitlines on the lower metal level are arranged with a bitline true (P1 True) bitline on a left side of the memory cell and a bitline complement (P1 Comp) bitline on a right side of the memory cell. To reduce overlapping restore sensitivity, the order of the upper metal level bitline pair (P2MWL) is flipped such that a true bitline (P2 True) is on a right side of the memory cell and a complement bitline (P2 Comp) is on the left side of memory cell.

To understand the electrical results of this configuration, consider the following discussion. Assume that one bitline, P1 True, is completely discharged following a write operation to memory cell 702 of FIG. 7. The P1 True bitline must now be precharged back to the first reference voltage (Vdd) prior to a subsequent snoop or read operation to the same memory cell (702) location. As the P1 True bitline is restored to the first reference voltage (Vdd), memory cell 702 is accessed by a second port to execute the read operation. A "ground-to-Vdd" transition on restoring bitline, P1 True, couples charge onto the port 2 bitline directly above or below P1 True. Thus, in FIG. 7, when the P1 True bitline is being restored, charge is coupled onto the P2 Comp bitline. By switching an order of the upper metal level bitline pair, the charge transferred to a vertical neighboring port is now transferred to a bitline side of the memory cell 702 for port 2 which has the logic high value. This transfer of charge to a bitline having a logic high signal on port 2 effectively "bootstraps" additional potential on that bitline.

This coupling results in an increase of the differential offset on the second port being read. Additionally, as the P1

Figure 11:
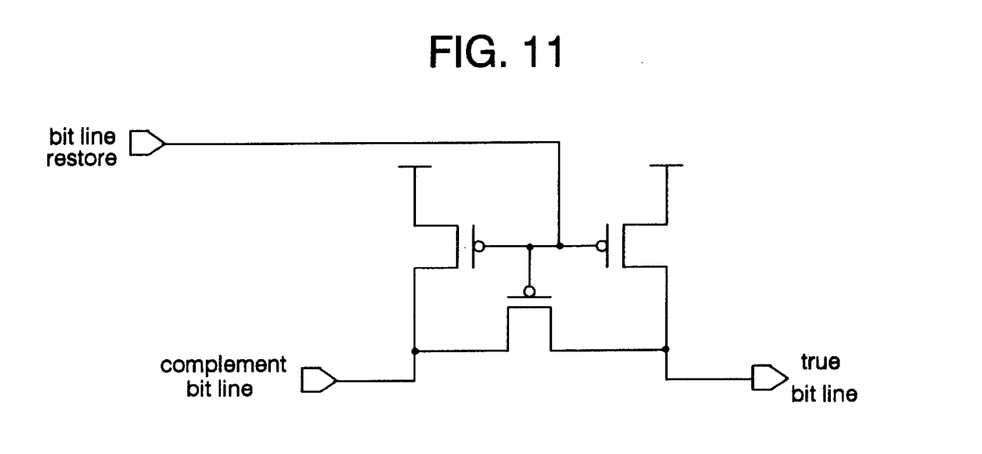
FIG. 11 illustrates a bit line restore circuit.

True bitline restores the Vdd reference voltage after a subsequent memory latch access during a read or write operation, a p-channel device (not illustrated in FIG. 7) coupled between the P1 True and P1 Comp bit pair inside a bitline restore circuit is enabled to short the true and complement bitlines together. One embodiment of the bitline restore circuit is illustrated in FIG. 11.

By implementing the aforementioned design, the P1 Comp bitline is quickly discharged as charge is transferred to the P1 True bitline being restored to the Vdd reference voltage. Both bitlines then equalize to an intermediate voltage. The downward transition from the Vdd reference voltage to the intermediate voltage on the P1 Comp bitline capacitively discharges the P2 True bitline which lays directly above or below the P1 Comp bitline. Following a write or back-to-back read request to a same memory cell, a bitline that is being actively discharged by a "low" side of the memory cell via the transfer device is also being capacitively assisted by the bitline discharge on a restoring port. This bitline assist increases the differential offset requiring less time to generate sufficient offsets to reliably sense the state of the memory latch.

Figure 8:
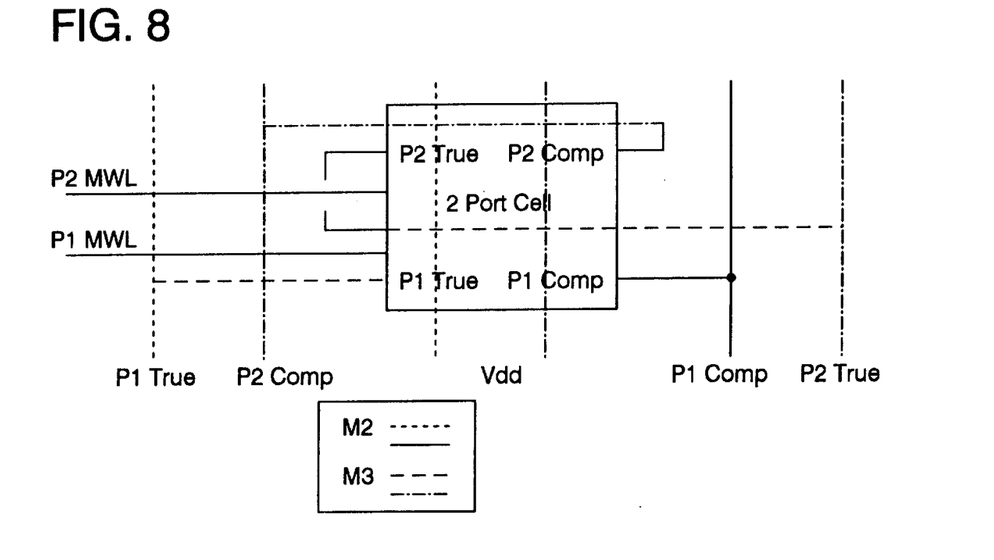
FIG. 8 illustrates, in block diagram form, a dual-port memory cell in accordance with one embodiment of the present invention.

In addition to the embodiments described above, one embodiment of the present invention includes another performance enhancement through the addition of an isolation channel between true and complement bitlines for both ports. This enhancement is illustrated in FIG. 8. To decrease capacitive coupling further, both true and complement bitlines on each port have been capacitively isolated from one another via parallel Vdd bus. For the memory latch application illustrated in FIG. 8, the Vdd reference voltage was chosen to isolate the bitlines for layout simplicity. In alternate embodiments, a ground signal would be used to isolate the bitlines.

Figure 9:
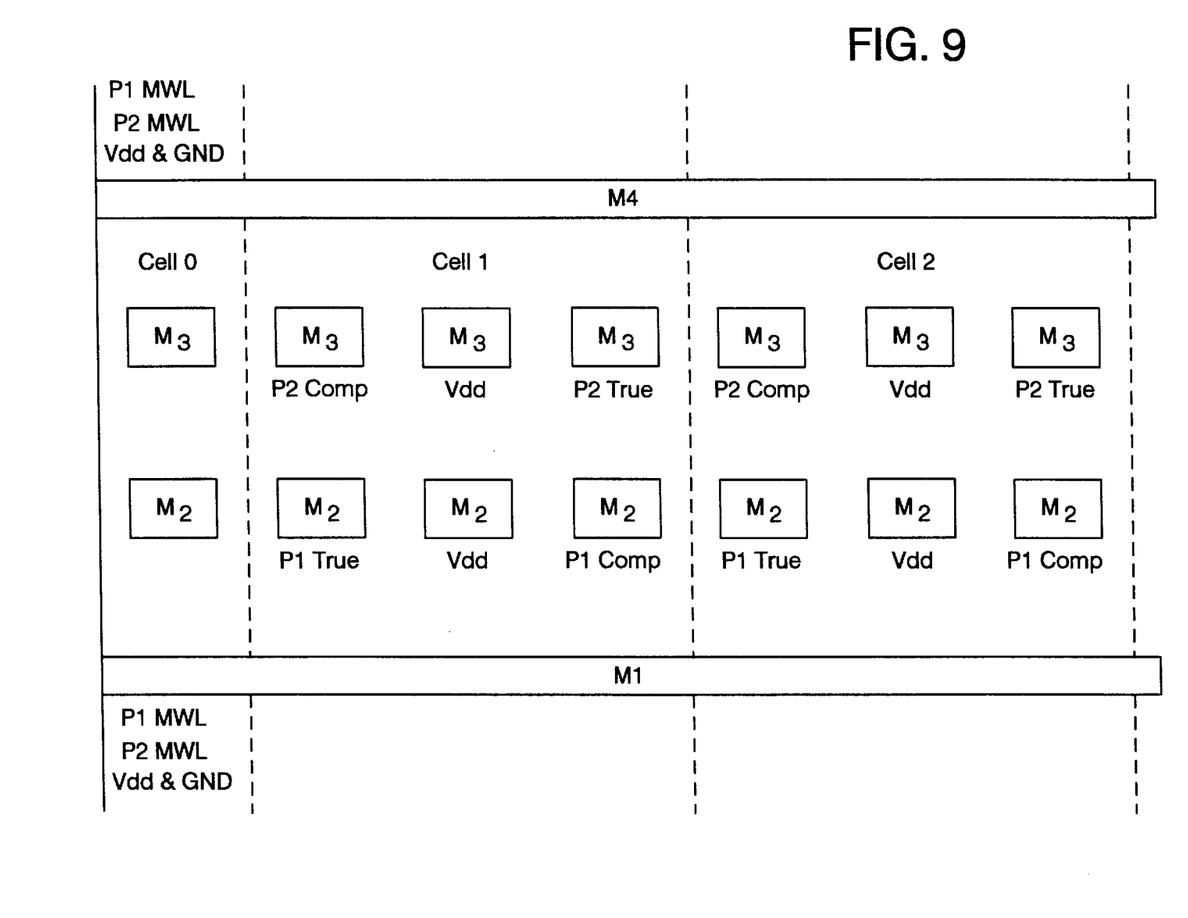
FIG. 9 illustrates, in a cross-section view, a layout of a dual-port memory cell in accordance with one embodiment of the present invention.

FIG. 9 illustrates, in a cross-section view, a layout of a plurality of memory cells, respectively labeled cell 0, cell 1, and cell 2, which are implemented in a semi-conductor device in accordance with one embodiment of the present invention. In FIG. 9, the term "M1" refers to a first metal layer, the term "M2" refers to a second metal layer, the term "M3" refers to a third metal layer, and the term "M4" refers to a fourth metal layer. The cross-section of FIG. 9 illustrates the relative position of the metal layers and the signal transferred thereby to illustrate the vertical bitline topology in the present invention.

Refer now to cell 1 of FIG. 9. As illustrated therein, a cross-section of the embodiment of the invention illustrated in FIG. 8 is provided. As may be seen therein, the P1 True bitline and the P1 Comp bitline are implemented in a second metal level. Similarly, the P2 Comp signal and the P2 True signals are implemented in a third metal layer. A Vdd isolation is implemented in both the second metal layer and the third metal layer. Thus, the P1 True bitline and the P1 Comp bitline are isolated from one another. The P2 True bitline and the P2 Comp bitline are similarly isolated from one another. Note from the configuration of cell 1 illustrated in FIG. 9 that the P2 Comp bitline is vertically positioned over the P1 True bitline in one embodiment of the present invention. Furthermore, the P2 True bitline is vertically positioned over the P1 Comp bitline in one embodiment of the present invention. As has been previously discussed, the vertical positioning of the present invention provides for capacitive assistance of bitlines actively discharged by a bitline discharged on a restoring port.

Figure 10A:
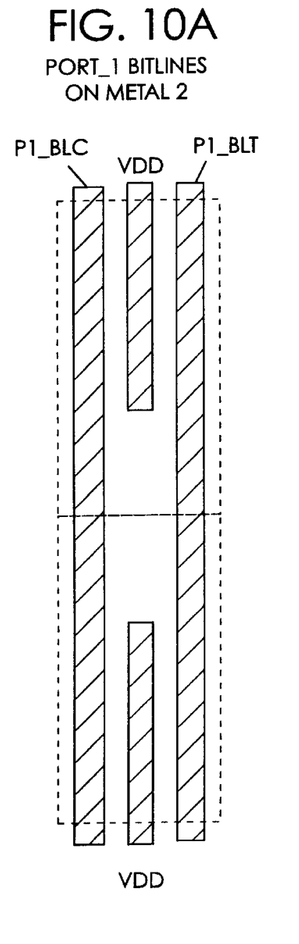
FIG. 10A, 10B and 10C illustrate in a topological view, a layout of a dual-port memory cell in accord with one embodiment of the present invention.

FIG. 10 illustrates a layout of the memory cell of the present invention in greater detail. A portion of FIG. 10 labeled "A" corresponds to the Port 1 bitlines, both true and complement, which are implemented within the second metal level. It should be noted that the signal labeled P1_BLC corresponds to the P1 Comp signal illustrated in FIG. 8. Additionally, the signal labeled P1_BLT corresponds to the P1 True signal in FIG. 9. The Vdd values correspond to the Vdd isolation illustrated therein.

Figure 10B:
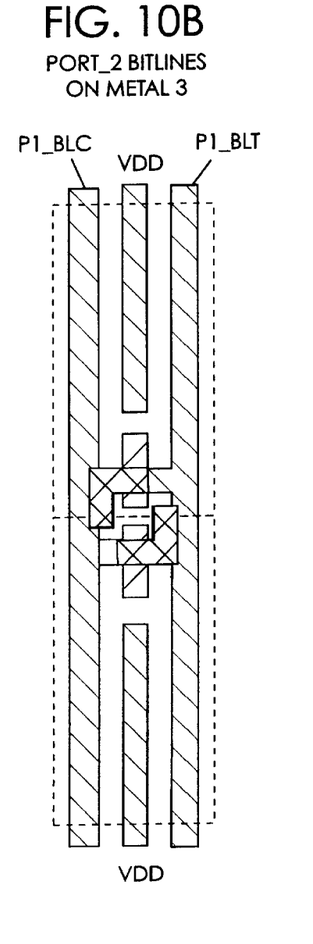

In a portion of FIG. 10 labeled "B", the topology of the port 2 bitlines, both true and complement, in the third metal level are illustrated. The signal labeled P2_BLT corresponds to the Port 2 True signal in FIG. 8 and the signal labeled P2_BLC corresponds to the P2 Comp signal of FIG. 8.

Figure 10C:
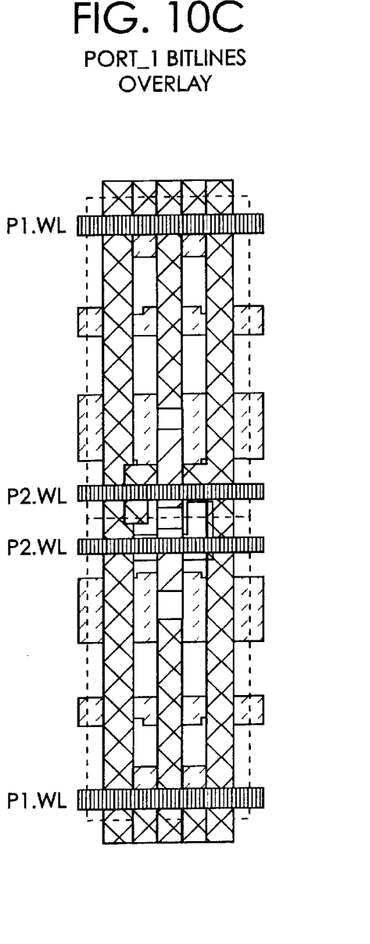

A portion of FIG. 10 labeled "C" illustrates the memory cell of FIG. 8 from a topological view. Note that the layout illustrated in the A and B portions of FIG. 10 are superimposed over one another in the C portion of FIG. 10. It should be noted that in the C portion of FIG. 10, the P1_WL signal corresponds to the Port 1 Wordline and the P2_WL signal corresponds to the Port 2 Wordline.

The aforementioned descriptions have provided a general description of operation in the present invention. As may be observed from each of the previously described figures, the present invention discloses an improved topology for multi-port memory cell layouts in which two or more bitline pairs are required for data transfers. As described above, in the present invention, bitlines are displaced vertically, rather than horizontally to take advantage of reduced capacitance between vertical layers (as opposed to horizontal layers) and the relative voltage discharge and charging operation within a dual-port memory cell. In addition to the advantages by such vertical placement, the implementation of the present invention described herein also recognizes and takes advantage of a relationship between adjacent memory cells when such a configuration is utilized.

Assume, for purposes of the following discussion, that a memory array is provided. The memory array is divided into repeated sub-sections to implement a memory which utilizes column decoding, or bitline decoding. For simplicity, assume that two sub-sections are available in this memory array. The decoded selection of a sub-section in a column or bitline dimension is determined by a single address bit in one embodiment of the present invention. For example, a "logical 0" may select all odd number bitline pairs and a "logical 1" value may select all even number bitline pairs.

Next, assume that all odd number cells in their respective bitlines have been selected in one operation which utilizes one embodiment of the present invention. Once selected the odd number cells begin to generate differential offsets onto their respective bitlines. To minimize capacitive coupling between cells with adjacent (left and right) bitline pairs, line-to-line isolation techniques are implemented. Such line-to-line isolation techniques include the Vdd isolation region implemented in the memory cell of FIG. 9.

Additionally, it should be noted that the process of isolating adjacent bitline pairs may be implemented by separating odd number bitlines with even number bitline pairs. Stated another way, odd number bitline pairs or even number bitline pairs, but not both, are selected at any one time. Therefore, since the odd number bitline pairs were selected for the example of operation provided herein, the odd number bitline pairs continue to develop differential offsets while the neighboring even number bitline pairs remain inactive and restored to the left and right of those odd bitline pairs. Therefore, a charging and discharging operation implemented by a read and write operation may be executed as the charging and discharging bitlines in adjacent memory cell locations are isolated from one another by the unselected cells. These unselected cells effectively provide a Vdd isolation between adjacent bitline locations similar to the Vdd isolation channel design within the memory cell itself.

The aforementioned description of the present invention is provided by way of example only. It should be noted that additional embodiments may also be implemented.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A memory cell in a data processing system, comprising:
   a first latch for storing a first data value, wherein the first latch comprises:
      a first true bitline; and
      a first complement bitline; and
   a second latch for storing a second data value, wherein the second latch comprises:
      a second true bitline; and
      a second complement bitline,
   wherein the first true bitline and the second complement bitline are vertically aligned and wherein the first complement bitline and the second true bitline are vertically aligned.

2. The memory cell of claim 1, wherein the first true bitline and the first complement bitline are manufactured in a first conductive layer.

3. The memory cell of claim 2, wherein the second true bitline and the second complement bitline are manufactured in a second conductive layer.

4. The memory cell of claim 1, further comprising:
   a first isolation region between the first true bitline and the first complement bitline.

5. The memory cell of claim 4, wherein the first isolation region is a Vdd isolation region.

6. The memory cell of claim 5, wherein the first isolation region is a ground isolation region.

7. The memory cell of claim 4, further comprising:
   a second isolation region between the second true bitline and the second complement bitline.

8. The memory cell of claim 7, wherein the second isolation region is a Vdd isolation region.

9. The memory cell of claim 7, wherein the second isolation region is a ground isolation region.

10. The memory cell of claim 1, wherein the first latch further comprises:
    a first transfer device for selectively transferring a third data value from the first complement bitline to a first terminal of the first transfer device;
    a first inverter having an input coupled to the first terminal of the first transfer device and having an output;
    a second transfer device for selectively transferring a fourth data value from the first true bitline to a first terminal of the second transfer device; and
    a second inverter having an input coupled to the first terminal of the second transfer device and an output coupled to the input of the first inverter.

11. The memory cell of claim 10, wherein the input of the second inverter is coupled to the output of the first inverter.

12. The memory cell of claim 1, wherein the second latch further comprises:
    a first transfer device for selectively transferring a third data value from the second true bitline to a first terminal of the first transfer device;
    a first inverter having an input coupled to the first terminal of the first transfer device and having an output;
    a second transfer device for selectively transferring a fourth data value from the second complement bitline to a first terminal of the second transfer device; and
    a second inverter having an input coupled to the first terminal of the second transfer device and an output coupled to the input of the first inverter.

13. The memory cell of claim 12, wherein the input of the second inverter is coupled to the output of the first inverter.

14. A method for implementing a memory cell having a first latch and a second latch, comprising the steps of:
    vertically aligning a first true bitline of the first latch and a second complement bitline of the second latch; and
    vertically aligning a first complement bitline of the first latch and a second true bitline of the second latch.

15. The method of claim 14, comprising the steps of:
    manufacturing the first true bitline and the first complement bitline in a first conductive layer; and
    manufacturing the second true bitline and the second complement bitline in a second conductive layer.

16. The method of claim 14, comprising the step of:
    manufacturing a first isolation region between the first true bitline and the first complement bitline.

17. The method of claim 16, comprising the step of:
    manufacturing a second isolation region between the second true bitline and the second complement bitline.

18. The method of claim 14, comprising the steps of:
    selectively transferring a first data value from the first complement bitline to a first terminal of a first transfer device;
    coupling an input of a first inverter to the first terminal of the first transfer device, wherein the first inverter has an output;
    selectively transferring a second data value from the first true bitline to a first terminal of a second transfer device; and
    coupling an input of a second inverter to the first terminal of the second transfer device, wherein the second inverter has an output coupled to the input of the first inverter.

19. The method of claim 18, comprising the step of:
    coupling the input of the second inverter to the output of the first inverter.

20. The method of claim 14, comprising the steps of:
    selectively transferring a first data value from the second true bitline to a first terminal of a first transfer device;
    coupling an input of a first inverter to the first terminal of the first transfer device, wherein the first inverter has an output;
    selectively transferring a second data value from the second complement bitline to a first terminal of a second transfer device;
    coupling an input of a second inverter to the first terminal of the second transfer device;
    coupling an output of the second inverter to the input of the first inverter; and
    coupling the input of the second inverter to the output of the first inverter.

* * * * *